United States Patent [19]
Ballard et al.

[11] Patent Number: 5,687,577
[45] Date of Patent: Nov. 18, 1997

[54] APPARATUS AND METHOD FOR SPRAY-COOLING AN ELECTRONIC MODULE

[75] Inventors: Gerald W. Ballard, West Dundee; James W. Turocy, Arlington Heights; Thomas R. Beise, Hoffman Estates, all of Ill.

[73] Assignee: Motorola, Inc., Schaumburg, Ill.

[21] Appl. No.: 630,284

[22] Filed: Apr. 10, 1996

[51] Int. Cl.⁶ .................. F25D 17/02; F25D 23/12; H05K 7/20
[52] U.S. Cl. .................. 62/64; 62/259.2; 62/376; 361/699; 361/689
[58] Field of Search .................. 62/64, 304, 373, 62/259.2, 376; 361/688, 689, 699

[56] References Cited

U.S. PATENT DOCUMENTS

| | | |
|---|---|---|
| 3,725,566 | 4/1973 | Plizak . |
| 4,399,484 | 8/1983 | Mayer . |
| 4,542,076 | 9/1985 | Bednarz et al. . |
| 4,706,164 | 11/1987 | L'Hennaff et al. . |
| 4,711,431 | 12/1987 | Viannay et al. . |
| 4,847,731 | 7/1989 | Smolley . |
| 4,854,377 | 8/1989 | Komoto et al. . |
| 4,884,167 | 11/1989 | Mine . |
| 4,912,600 | 3/1990 | Jaeger et al. . |
| 4,935,864 | 6/1990 | Schmidt et al. . |
| 4,945,980 | 8/1990 | Umezawa . |
| 4,964,019 | 10/1990 | Belanger, Jr. . |
| 5,014,777 | 5/1991 | Sano . |
| 5,050,037 | 9/1991 | Yamamoto et al. . |
| 5,057,968 | 10/1991 | Morrison . |
| 5,131,233 | 7/1992 | Cray et al. . |
| 5,166,863 | 11/1992 | Shmunis . |
| 5,174,364 | 12/1992 | Mizuno et al. . |
| 5,175,395 | 12/1992 | Moore . |
| 5,177,666 | 1/1993 | Bland et al. . |
| 5,183,104 | 2/1993 | Novotny .................. 165/104.33 |
| 5,190,099 | 3/1993 | Mon . |
| 5,210,440 | 5/1993 | Long . |
| 5,220,804 | 6/1993 | Tilton et al. .................. 62/64 |
| 5,232,164 | 8/1993 | Resch et al. . |
| 5,256,833 | 10/1993 | Schwenk . |
| 5,264,984 | 11/1993 | Akamatsu . |
| 5,270,572 | 12/1993 | Nakajima et al. .................. 361/689 |
| 5,285,351 | 2/1994 | Ikeda . |
| 5,289,363 | 2/1994 | Ferchau et al. . |
| 5,329,419 | 7/1994 | Umezawa . |
| 5,348,076 | 9/1994 | Asakawa . |
| 5,349,831 | 9/1994 | Daikoku et al. .................. 62/376 |
| 5,360,993 | 11/1994 | Mine . |
| 5,384,687 | 1/1995 | Sano . |
| 5,388,030 | 2/1995 | Gasser et al. . |
| 5,431,974 | 7/1995 | Pierce . |
| 5,436,501 | 7/1995 | Ikeda . |
| 5,436,793 | 7/1995 | Sanwo et al. . |
| 5,463,528 | 10/1995 | Umezawa . |
| 5,483,423 | 1/1996 | Lewis et al. . |
| 5,491,363 | 2/1996 | Yoshikawa . |
| 5,522,452 | 6/1996 | Mizuno et al. .................. 165/40 |

OTHER PUBLICATIONS

IBM Technical Disclosure Bulletin: Three–Dimensional MLC Substrate Integrated Circuit Support Package, vol. 20 No. 11A, Apr. 1978.

Kurt A. Estes and Issam Mudawar, "Comparison of Two–Phase Electronic Cooling Using Free Jets and Sprays", Journal of Electronic Packaging, vol. 117, pp. 323–331, Dec. 1995.

M. Ghodbane et al., "Experimental Study of Spray Cooling with Freon–113", Int. J. Heat Mass Transfer, vol. 34, No. 4/5, pp. 1163–1174 (1991).

(List continued on next page.)

*Primary Examiner*—William Doerrler
*Attorney, Agent, or Firm*—Heather L. Creps

[57] ABSTRACT

The apparatus includes a plate (10) having a first layer (12) and a second layer (14) opposed to the first layer (12). The second layer (14) includes a first substrate. A fluid distributing manifold (28) is disposed proximate the first layer (12). A nozzle housing (30) having an aperture (36) is disposed in the first fluid distributing manifold (28).

19 Claims, 3 Drawing Sheets

OTHER PUBLICATIONS

J.P. Holman et al., "Extended Studies of Spray Cooling with Freon–113", Int. J. Heat Mass Transfer, vol. 36, No. 8, pp. 2239–2241 (1992).

Donald E. Tilton et al., "High–Flux Spray Cooling in a Simulated Multichip Module", HTD–vol. 206–2, Topics in Heat Transfer–vol. 2, ASME (1992).

S.K. Chen et al., "Factors Influencing the Effective Spray Cone Angle of Pressure–Swirl Atomizers", Journal of Engineering for Gas Turbines and Power, vol. 114, pp. 97–103 (Jan. 1992).

Donald Tilton et al., "Advanced Thermal Management for Multichip Modules", Electronic Packaging and Production, pp. 71–73 (Aug. 1995).

Kurt A. Estes et al., "Correlation of Sauter Mean Diameter and Critical Heat Flux for Spray Cooling of Small Surfaces", Int. J. Heat Mass Transfer, vol. 38, No. 16, pp. 2985–2996 (1995).

10

APPARATUS AND METHOD FOR SPRAY-COOLING AN ELECTRONIC MODULE

This application is related to copending application Ser. No. 08/630,185, filed Apr. 10, 1996, commonly assigned with the present invention.

FIELD OF THE INVENTION

This invention relates generally to the cooling of electronic modules, and, more particularly, to an apparatus and method for spray-cooling an electronic module.

BACKGROUND OF THE INVENTION

Electronic modules such as multi-chip modules, electronic hybrid assemblies such as power amplifiers, and passive components such as filters may contain heat sources which require cooling during normal operation. Often, electronic modules are disposed on substrates such as printed circuit boards, and operate in rack-type housings such as Versa Module Europe (VME) cages or Electronic Industries Association (EIA) sub-racks.

Generally, electronic modules and their associated components are cooled by natural or forced air convection which, because of the relatively poor thermal capacitance and heat transfer coefficients of air, requires moving large volumes of air past the electronic modules, or past heavy heat sinks attached to the modules. In a rack-type housing, air-cooling may result in wide spacing between the electronic modules, which could cause the housing to be overly large. In addition, the air cooling process may introduce undesired acoustic noise or other contaminants, such as dust, into the electronic modules.

Evaporative spray cooling features the spraying of atomized fluid droplets directly onto a surface of a heat source such as an electronic module. When the fluid droplets impinge upon the module's surface, a thin film of fluid coats the module, and heat is removed primarily by evaporation of the fluid from the module's surface.

Although evaporative spray cooling is a preferred method of heat removal in many electronics applications, housings for electronic modules must frequently be re-designed for the purpose of spray-cooling the electronic modules.

There is therefore a need for an apparatus and method for spray-cooling an electronic module which may be integrated into a traditional rack-type housing.

SUMMARY OF THE INVENTION

According to an aspect of the present invention, the foregoing need is addressed by an apparatus for spray-cooling an electronic module which includes a plate having a first layer and a second layer opposed to the first layer. The second layer includes a first substrate. A fluid distributing manifold is disposed proximate the first layer. A nozzle housing having an aperture is disposed in the first fluid distributing manifold.

According to another aspect of the present invention, an apparatus for spray-cooling an electronic module includes a plate having a first layer and a second layer opposed to the first layer. The first layer has an interior surface and an exterior surface. A fluid distributing manifold is formed in the interior surface of the first layer. A nozzle is disposed in the fluid distributing manifold, the nozzle having a receptacle end and a spray end. The spray end has an aperture. The receptacle end is in communication with the fluid distributing manifold and the spray end is in communication with the exterior surface of the first layer. A substrate is in communication with the interior surface of the first layer. The receptacle end receives a fluid from the fluid distributing manifold, the spray end atomizes the fluid and discharging the atomized fluid through the aperture.

According to a further aspect of the present invention, a method for spray-cooling an electronic module includes providing a plate having a first layer and a second layer opposed to the first layer, the first layer having a fluid distributing manifold therein and the second layer comprising a substrate; receiving a fluid by a nozzle disposed in the fluid distributing manifold, the nozzle having an aperture; and discharging the fluid via the aperture.

Advantages of the present invention will become readily apparent to those skilled in the art from the following description of the preferred embodiments of the invention which have been shown and described by way of illustration. As will be realized, the invention is capable of other and different embodiments, and its details are capable of modifications in various respects. Accordingly, the drawings and description are to be regarded as illustrative in nature, and not as restrictive.

DETAILED DESCRIPTION OF THE PREFERRED EMBODIMENTS

Figure 1:
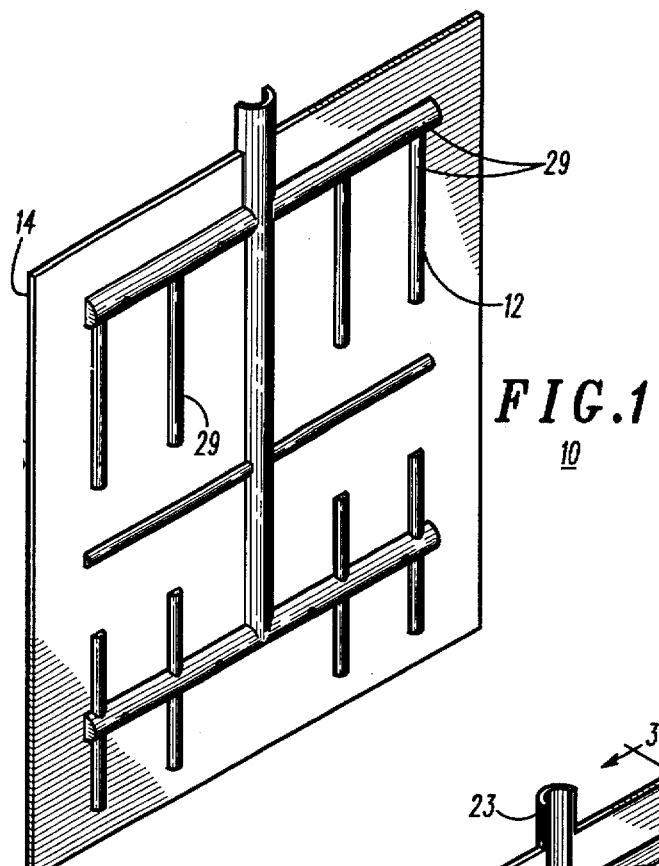
FIG. 1 is a partial perspective view of an apparatus for spray-cooling an electronic module according to a preferred embodiment of the present invention.

Turning now to the drawings, wherein like numerals designate like components, FIG. 1 is a partial perspective view of an apparatus for spray-cooling an electronic module according to a preferred embodiment of the present invention. As shown, the apparatus includes a plate 10 that is substantially rectangular. Plate 10, however, may be any desired shape, and may be constructed of any suitable material, for example plastic or a metal such as aluminum.

Figure 2:
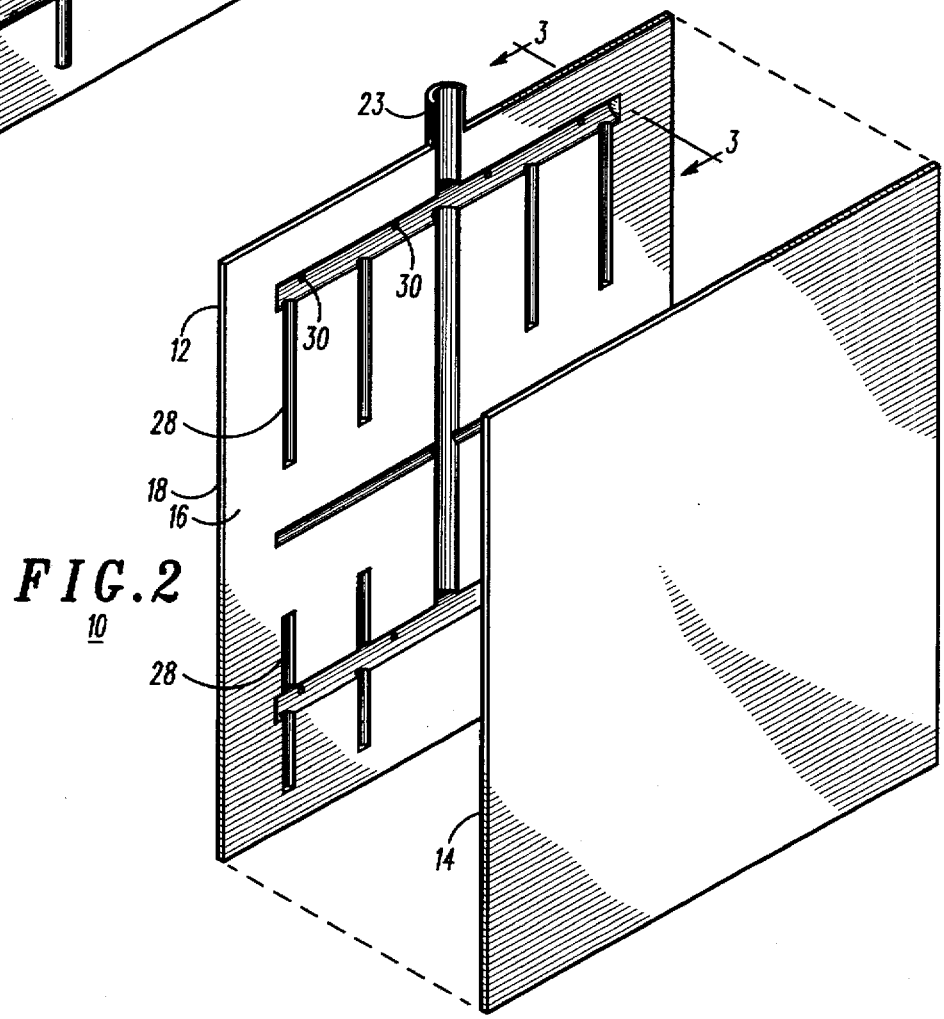
FIG. 2 is an expanded perspective view of the apparatus depicted in FIG. 1.

Plate 10 has a first layer 12 and a second layer 14. Second layer 14 is preferably a circuit board, such as a printed circuit board. First layer 12 is preferably a backing, or substrate, of the circuit board, for example, a carrier plate for ceramic substrates. As shown in FIG. 2, first layer 12 and second layer 14 may be separate pieces, which may be fastened together using a variety of methods and materials. For example, fasteners such as screws, compliant gaskets, bonding, ultrasonic welding, soldering or brazing may be utilized. Alternatively, plate 10 may be a single part, with internal passages (discussed further below) being formed in first layer 12 during fabrication of the circuit board.

When first layer 12 is separated from second layer 14, as depicted in FIG. 2, it can be seen that first layer 12 has an interior surface 16 and an exterior surface 18 (not visible).

At least one fluid distributing manifold 28 is disposed in interior surface 16 of first layer 12. A number of fluid distributing manifolds 28, which as shown in FIG. 1, result in protrusions 29 on exterior surface 18 of first layer 12, are depicted in FIG. 2. Fluid distributing manifolds 28 may be grooves or passages of small cross-sectional diameter which form conduits within plate 10. Fluid distributing manifolds 28 may have any cross-sectional shape. Conical, rectangular or circular cross-sectional shapes are preferred.

A fluid inlet port 23 may be formed integrally with side 12 or side 14, as shown in FIG. 2. Alternatively, a fluid inlet port 23 may be separately coupled to plate 10, using a barbed fitting, for example.

Figure 3:
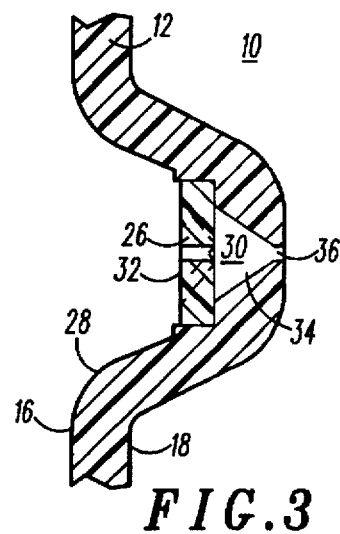
FIG. 3 is a cross-sectional view of the apparatus depicted in FIG. 2 along line 3—3, illustrating a nozzle housing according to the preferred embodiment of the present invention.

At least one nozzle housing 30 is disposed in at least one fluid distributing manifold 28. FIG. 3 is a cross-sectional view of FIG. 2 along line 3—3, illustrating one nozzle housing 30 in first layer 12. Nozzle housing 30 has a receptacle end 32 which is disposed on fluid distributing manifold 28. A spray end 34 of nozzle housing 30 is at least in part in communication with exterior surface 18 of first layer 12, and includes an aperture 36. Aperture 36 is preferably on the order of 0.15 mm in diameter.

Each nozzle housing 30 is sized to receive a nozzle 26, which may be, as shown in FIG. 3, a swirl plate or insert. Nozzle 26 may be secured to nozzle housing 30 by, for example, press-fitting, soldering or bonding. Alternatively, nozzle 26 may be integrally formed in fluid distributing manifold 28.

Nozzles 26 are preferably miniature atomizers such as simplex pressure-swirl atomizers, which are approximately 0.3 mm high, and may be made of any suitable material. An example of a suitable material is a metallic material such as brass or stainless steel. Simplex pressure-swirl atomizers are described in detail in U.S. Pat. No. 5,220,804 to Tilton et al., incorporated herein by reference, and are commercially available from Isothermal Systems Research, Inc., located in Colton, Wash.

Figure 4:
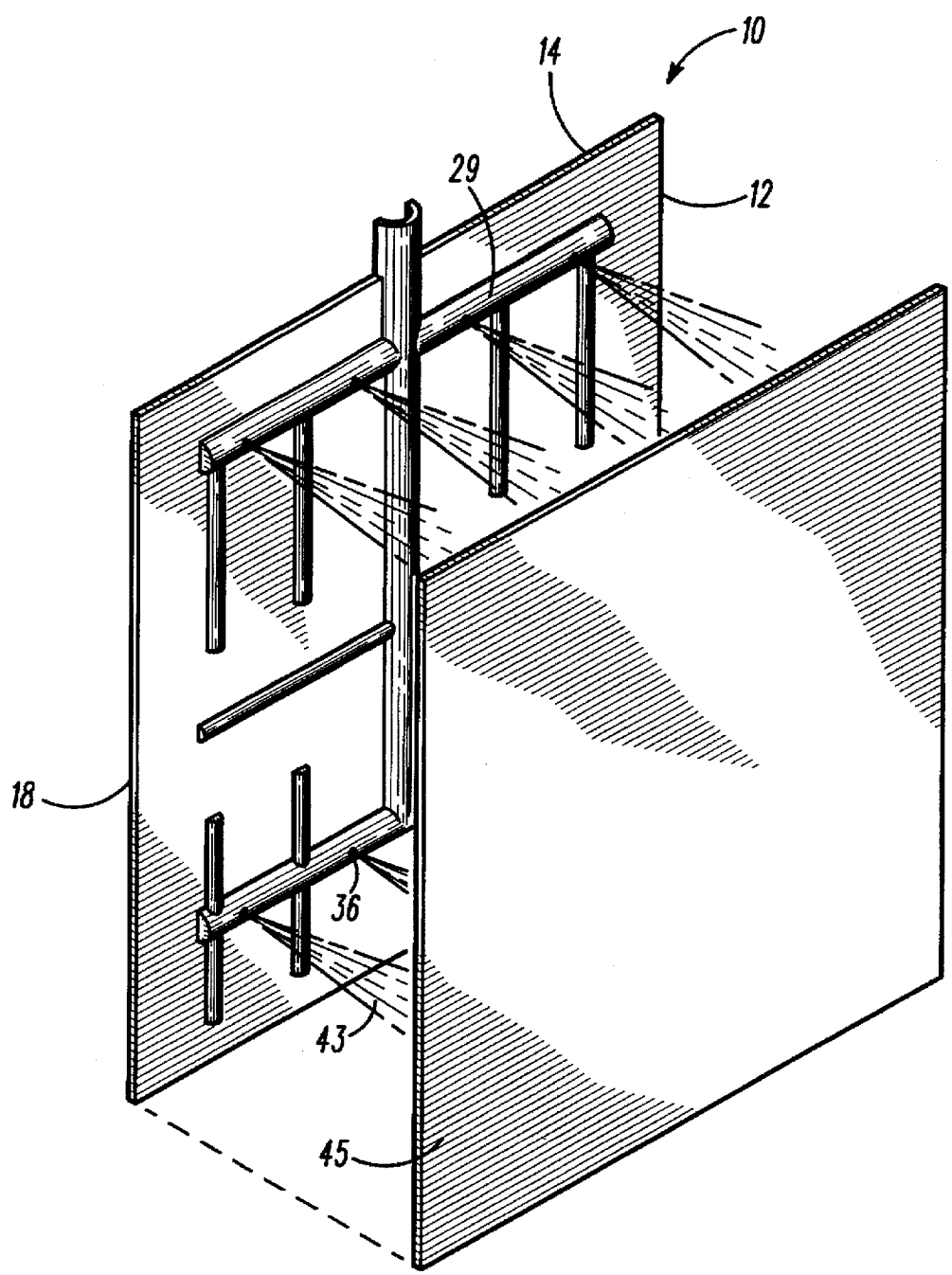
FIG. 4 is a perspective view of the apparatus illustrated in FIGS. 1 and 2, depicting a manner of operation for simultaneously cooling electronic modules on two printed circuit boards.

FIG. 4 depicts a manner of operation of plate 10, for cooling electronic modules on an adjacent printed circuit board 45. Referring to FIGS. 1 through 4 collectively, fluid distributing manifolds 28 in first layer 12 receive a coolant fluid via fluid inlet port 23, and supply the fluid to receptacle ends 32 of a number of nozzles 26 disposed in fluid distributing manifolds 28. Spray ends 34 of nozzles 26 atomize the fluid and discharge the atomized fluid 43 through apertures 36, preferably at a perpendicular angle to exterior surface 18. Alternatively, atomized fluid 43 may be discharged at a slight angle to exterior surface 18. Atomized fluid 43 is sprayed onto a printed circuit board 45, which may include electronic modules such as multi-chip modules, electronic hybrid assemblies or passive components, among other things. Printed circuit board 45 may be a second layer 14, for example, of a second plate 10 (not shown).

The coolant fluid is preferably a dielectric fluid such as 3M's Fluorinert™ dielectric fluid, order number FC-72, but may be another suitable dielectric fluid, such fluids being well-known and widely available. For example, a perfluorocarbon fluid similar to 3M's Fluorinert™ dielectric fluid is available from Ausimont Galden®.

An electronic module having a power density of up to three-hundred Watts per square centimeter is effectively cooled by first layer 12 of plate 10. The removal of heat directly from electronic modules helps to reduce operating temperatures of the modules and their associated components, increasing reliability through significant reduction of thermal variation and associated thermal stresses.

Figure 5:
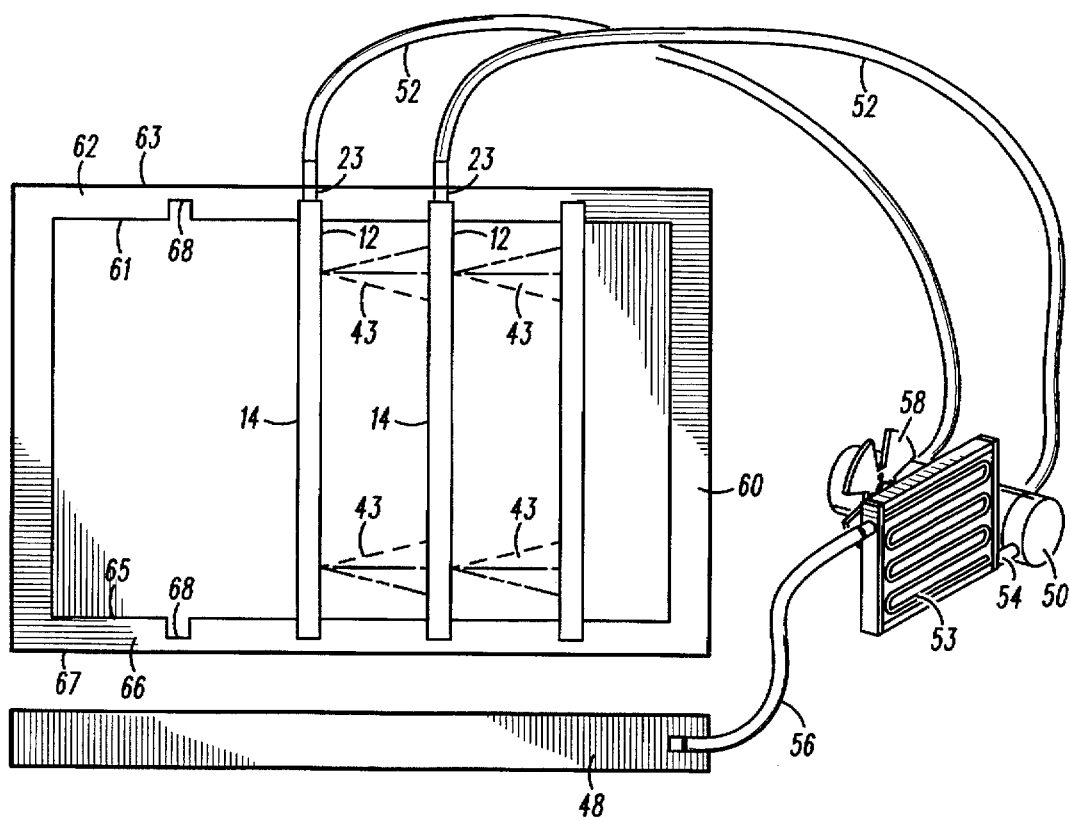
FIG. 5 illustrates a rack-type housing and a closed-loop fluid flow for the apparatus shown in FIGS. 1 through 4.

FIG. 5 illustrates a rack-type housing and a closed-loop fluid flow for the apparatus shown in FIGS. 1 through 4. Chassis 60, which defines a substantially rectangular chamber of any desired size, may be, for example, a Versa Module Europe (VME) rack-type housing. Chassis 60 may be constructed of any suitable material, for example plastic or a metal such as aluminum, and may be partitioned to create multiple chambers.

In one possible construction of chassis 60, a top wall 62 which has two sides, an interior side 61 and an exterior side 63, opposes a bottom wall 66 which also has an interior side 65 and an exterior side 67. A number of guides 68 are formed in interior side 61 of top wall 62 and in interior side 65 of bottom wall 66. Guides 68 on top wall 62 are in substantial alignment with guides 68 on bottom wall 66. Guides 68 optionally provide electrical interconnection for electronic modules. Alternatively, electrical interconnection may be provided via a backplane (not shown) of chassis 60.

In the preferred embodiment of the present invention, plates 10 having second layers 14 which are preferably printed circuit boards are secured between pairs of guides 68. A plate 10 is positioned with first layer 12 facing an adjacent printed circuit board, so that electronic modules on the adjacent printed circuit board are cooled by atomized fluid 43 discharged from first layer 12.

As shown in FIG. 5, atomized fluid 43 is sprayed from two first layers 12 onto adjacent printed circuit boards in a substantially similar manner. It is contemplated, however, that placement of nozzles 26 and/or the arrangement of fluid distributing conduits 28 located in interior surfaces 16 of first layers 12 may be different for each plate 10 housed in chassis 60, to accommodate specific cooling requirements of a particular printed circuit board being spray-cooled.

Large spacing constraints between electronic modules which may be present in an air-cooled rack-type housing are rendered essentially non-existent when using the spray-cooling plate 10 described herein. Plate 10 may be placed virtually as close to a surface of an electronic module on a printed circuit board as the heights of components (not shown) attached to the module allow, resulting in compact module packaging because spacing within chassis 60 may be determined primarily by component height, rather than by air volume requirements. And unlike air cooling, which is most effective when heat is spread over a large area, for example, over a large heat sink, spray cooling encourages heat concentration, another factor contributing to reduced package volume and weight.

Referring again to FIG. 5, one example of a closed-loop fluid flow for chassis 60 is illustrated. Fluid supply tube 52 may be attached to fluid inlet ports 23, to provide a flow of coolant fluid to conduits formed by fluid distributing manifolds 28 within plates 10. Alternatively, a fluid supply reservoir (not shown) may be attached and sealed to a perimeter of exterior side 63 of top wall 62 to provide coolant fluid to plates 10. As a further alternative, a fluid backplane (not shown) may be coupled to chassis 60 to supply coolant to plates 10.

A fluid discharge reservoir 48 is attached and sealed to exterior side 67 of bottom wall 66. Fluid discharge manifold 48 collects and drains fluid removed from chassis 60. Fluid preferably exits chassis 60 via openings (not shown) in bottom wall 66, aided by gravity. Of course, it may be desirable to further seal chassis 60, to reduce leakage of coolant fluid.

Fluid pumps 50, which are coupled to fluid supply tube 52, provide a fluid flow. It will be appreciated that a single fluid pump 50 may also be used. A condenser 53, connected to pumps 50 by tube 54 and to fluid discharge manifold 48 by tube 56, receives fluid from fluid discharge manifold 48. Condenser 53 rejects heat from the fluid, returning it to primarily a liquid phase. Fan 58 may be used to extend the cooling capacity of condenser 53. Cooled fluid is supplied from condenser 53 to fluid pumps 50. Thus, a closed-loop flow of coolant fluid is formed. It will be appreciated that at any given point in the system the coolant fluid may be a vapor, a liquid or a vapor and liquid mixture.

It is contemplated that any conventional means for providing flow of a coolant may be used in conjunction with the described embodiments of the present invention. It is further contemplated that more than one chassis 60 may be connected to a single source of coolant, and that one or more sources of coolant may be connected to a single chassis 60, for redundancy purposes, for example.

Sizes of fluid pump 50, condenser 53 and fan 58 should be selected based on heat removal and flow-rate requirements. For example, a typical closed loop fluid flow is 500 to 1000 milliliters per minute for 500 to 1000 Watts of heat dissipation. Pump and condenser assemblies in various sizes are available from Isothermal Systems Research, Inc., and acceptable tubing and fittings may be obtained from Cole-Parmer in Vernon Hills, Ill.

The closed-loop fluid flow system described herein has many advantages. For example, it is easily retrofitted to existing rack-type housings. And the system does not require managing a multitude of fluid lines or positioning individual spray nozzles. Consequently, despite the increase in heat density as circuits are further integrated and physical space on and between electronic modules on printed circuit boards is reduced, the fluid delivery and discharge system associated with the apparatus described herein should not increase in complexity.

The system has also been designed for convenient serviceability. For example, repairing the spray cooling system may be as simple as removing plate 10 from chassis 60, and typically would not involve disconnecting and repositioning numerous fluid lines. Likewise, the system design provides for unobstructed access to individual spray-cooled electronic modules, further facilitating inspection and repair of the modules.

It will be understood that while the embodiments described show electronic modules being cooled during normal operation, the present invention is not limited to cooling during ordinary operation of the electronic modules, but may be adapted to, for example, testing and evaluation of the electronic modules or the electronic circuit devices included in the modules.

It will be further understood that wherever sealing and/or fastening may be required, numerous methods and materials may be used. For example, fasteners such as screws, compliant gaskets, ultrasonic welding, brazing, soldering or swaging may be utilized.

It will also be apparent that other and further forms of the invention may be devised without departing from the spirit and scope of the appended claims and their equivalents, and it will be understood that this invention is not to be limited in any manner to the specific embodiments described above, but will only be governed by the following claims and their equivalents.

We claim:

1. An apparatus for spray-cooling an electronic module, the apparatus comprising:
   a plate having a first layer and a second layer opposed to the first layer, the second layer comprising a first substrate;
   a fluid distributing manifold disposed proximate the first layer; and
   a nozzle housing having an aperture, the nozzle housing disposed in the first fluid distributing manifold, the aperture positioned to discharge a fluid away from the second layer.

2. The apparatus according to claim 1, further comprising:
   a fluid inlet port coupled to the fluid distributing manifold.

3. The apparatus according to claim 2, wherein the fluid inlet port supplies the fluid to the fluid distributing manifold.

4. The apparatus according to claim 3, wherein the plate is disposed adjacent to a second substrate having the electronic module attached thereto, the second substrate comprising a printed circuit board.

5. The apparatus according to claim 4, wherein the plate is disposed in a Versa Module Europe (VME) cage.

6. The apparatus according to claim 4, wherein a nozzle is disposed in the nozzle housing.

7. The apparatus according to claim 6, wherein the nozzle atomizes the fluid and discharges the atomized fluid through the aperture.

8. The apparatus according to claim 7, wherein the atomized fluid is discharged at a substantially perpendicular angle to the first layer and onto the electronic module.

9. The apparatus according to claim 3, wherein the fluid comprises a dielectric fluid.

10. The apparatus according to claim 1, wherein the electronic module is selected from the group consisting essentially of: a passive component, a multi-chip module, and an electronic hybrid assembly.

11. The apparatus according to claim 1, wherein the fluid distributing manifold comprises a tube.

12. The apparatus according to claim 1, wherein the second layer comprises a circuit board.

13. The apparatus according to claim 1, wherein the first layer comprises a backing for a circuit board.

14. The apparatus according to claim 13, wherein the backing comprises a carrier plate for ceramic substrates.

15. The apparatus according to claim 1, wherein the first layer is fastened to the second layer.

16. An apparatus for spray-cooling an electronic module, the apparatus comprising:
   a plate having a first layer and a second layer opposed to the first layer, the first layer having an interior surface and an exterior surface;
   a fluid distributing manifold formed in the interior surface of the first layer;
   a nozzle disposed in the fluid distributing manifold, the nozzle having a receptacle end and a spray end, the spray end having an aperture, the receptacle end in communication with the fluid distributing manifold and the spray end in communication with the exterior surface of the first layer; and
   a substrate in communication with the interior surface of the first layer,
   the receptacle end receiving a fluid from the fluid distributing manifold, the spray end atomizing the fluid and discharging the atomized fluid through the aperture.

17. A method for spray-cooling an electronic module, the method comprising the steps of:

providing a plate having a first layer and a second layer opposed to the first layer, the first layer having a fluid distributing manifold therein and the second layer comprising a substrate;

receiving a fluid by a nozzle disposed in the fluid distributing manifold, the nozzle having an aperture, the aperture positioned to discharge the fluid away from the second layer; and discharging the fluid via the aperture.

18. An apparatus for spray-cooling an electronic module, the apparatus comprising:

a plate disposed adjacent a second substrate having the electronic module attached thereto, the plate having a first layer and a second layer opposed to the first layer, the second layer comprising a first substrate, the plate disposed in a Versa Module Europe (VME) cage;

a fluid distributing manifold disposed proximate the first layer;

a fluid inlet port coupled to the fluid distributing manifold, the fluid inlet port supplying a fluid to the fluid distributing manifold; and a nozzle housing having an aperture, the nozzle housing disposed in the first fluid distributing manifold and having a stainless steel nozzle disposed therein.

19. The apparatus according to claim 1, wherein the first layer and the second layer are integrally formed.

* * * * *